United States Patent [19]
Yamada et al.

[11] Patent Number: 5,935,911
[45] Date of Patent: Aug. 10, 1999

[54] SUPERCONDUCTING WIRE AND METHOD OF MANUFACTURING THE SAME

[75] Inventors: Yutaka Yamada, Kawasaki; Satoru Murase, Yokohama; Hisashi Yoshino, Machida; Noboru Fukushima; Hiromi Niu, both of Tokyo; Shigeo Nakayama, Yokohama; Misao Koizumi, Kawasaki, all of Japan

[73] Assignee: Kabushiki Kaisha Toshiba, Kawasaki, Japan

[21] Appl. No.: 08/463,777

[22] Filed: Jun. 5, 1995

Related U.S. Application Data

[62] Division of application No. 08/320,785, Oct. 11, 1994, which is a continuation of application No. 08/164,773, Dec. 10, 1993, abandoned, which is a continuation of application No. 08/022,861, Feb. 25, 1993, abandoned, which is a continuation of application No. 07/873,681, Apr. 24, 1992, abandoned, which is a continuation of application No. 07/617,928, Nov. 26, 1990, abandoned, which is a continuation of application No. 07/167,313, Mar. 11, 1988, abandoned.

[30] Foreign Application Priority Data

| Mar. 13, 1987 | [JP] | Japan | 62-56852 |
| Mar. 13, 1987 | [JP] | Japan | 62-56856 |
| May 11, 1987 | [JP] | Japan | 62-114312 |
| May 11, 1987 | [JP] | Japan | 62-114315 |
| Dec. 19, 1987 | [JP] | Japan | 62-321723 |
| Dec. 19, 1987 | [JP] | Japan | 62-321724 |

[51] Int. Cl.$^6$ ................................. H01B 12/00
[52] U.S. Cl. .................. 505/230; 505/232; 505/236; 505/237; 505/239; 505/704; 174/125.1; 428/373; 428/702; 428/930; 29/599
[58] Field of Search ................... 428/688, 373, 428/930, 689, 701, 702; 505/230, 231, 239, 701, 702, 703, 704, 740, 232, 236, 237; 174/125.1; 29/599

[56] References Cited

U.S. PATENT DOCUMENTS

| 4,826,808 | 5/1989 | Yurek | 428/930 |
| 4,952,554 | 8/1990 | Jin | 505/740 |
| 4,973,575 | 11/1990 | Capone | 505/740 |
| 5,151,406 | 9/1992 | Sawada | 505/701 |

FOREIGN PATENT DOCUMENTS

| 62-56559 | 3/1987 | Japan . |
| 64-617 | 1/1989 | Japan . |
| 9-185914 | 7/1997 | Japan . |
| 9-185915 | 7/1997 | Japan . |
| 9-185916 | 7/1997 | Japan . |

OTHER PUBLICATIONS

M. K. Wu, et al., Physical Review Letter, vol. 58, No. 9, pp. 908 to 910, "Superconductivity at 40K in a New Mixed-–Phase Y–Ba–Cu–O Compound System at Ambient Pressure", Mar. 2, 1987.

Thomas Luhman, et al., J. Appl. Phys. vol. 49, No. 2, pp. 936 and 938, Superconducting Wires of $PbMo_{5.1}S_6$ by a Powder Technique, Feb. 1978.

(List continued on next page.)

*Primary Examiner*—Marie Yamnitzky
*Attorney, Agent, or Firm*—Oblon, Spivak, McClelland, Maier & Neustadt, P.C.

[57] ABSTRACT

A starting material which is converted to a continuous body of an oxide superconductor by a heat treatment is filled in a tubular Ag sheath member. The diameter of the filled member is reduced by extrusion to form a wire. The wire is subjected to a heat treatment so that the starting material inside the sheath member is converted to a continuous body of an oxide superconductor. A superconducting wire constituted by the sheath member and the oxide superconductor filled inside the sheath member is obtained. A superconducting coil can be obtained by winding the superconducting wire.

26 Claims, 3 Drawing Sheets

OTHER PUBLICATIONS

R. Roberge, et al., Proceedings of the Topical Conference on A15 Superconductors, pp. 250 to 252, "In SITU and Powder Metallurgy Multifilamentary Superconductors: Fabrication and Properties", May 1980.

B. Seeber, et al., IEEE Transactions on Magnetics, vol. MAG–19, No. 3, pp. 402 to 405, Investigation of the Properties of $PbMo_6S_8$ Powder Processed Wires, May 1983.

U. Roy, et al., IEEE Transactions on Magnetics, vol. MAG–13, No. 1, "Preparation and Superconducting Properties of Lithium Titanate", Jan. 1977, pp. 836, 838 and 839.

Y. Kimura, Phys. Stat. Sol. (a) 69, pp. K189 to K192, "Superconducting Properties of the $PbMo_6S_8$ Conductor Produced by Solid State Reaction", 1982.

Nelson, Chemistry of High Temp. Superconductors II, Sahu et al., Chapter 1 (1988).

Superconductor's Material Problems, Science vol. 240, Apr. 1, 1988 pp. 25–27.

Scientific American, "Theoretical Resistance", Dec. 1992 pp. 24–25.

Koinuma, Jap Journ. of App. Phys. vol. 26, No. 5, May 1987 L763–L765.

Geballe, Science vol. 259, Mar. 12, 1993 pp. 1550–1551.

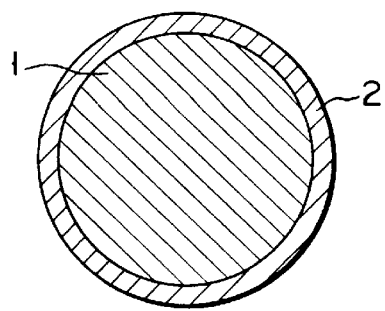
F I G. 1
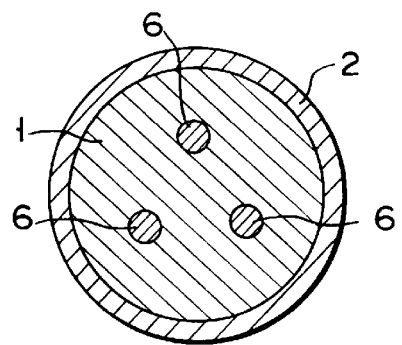
F I G. 2
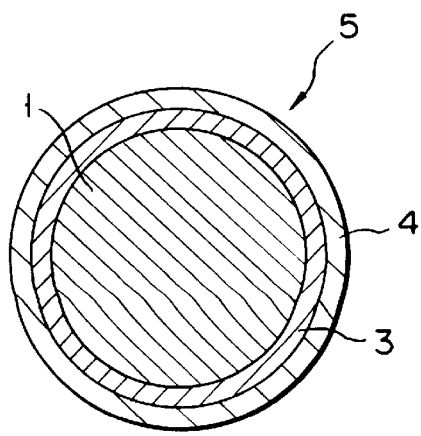
F I G. 3

5,935,911

SUPERCONDUCTING WIRE AND METHOD OF MANUFACTURING THE SAME

This is a Division of application Ser. No. 08/320,785, filed on Oct. 11, 1994, which is continuation of application Ser. No. 08/164,773, filed on Dec. 10, 1993, abandoned, which is a continuation application Ser. No. 08/022,861, filed on Feb. 25, 1993, abandoned, which is a continuation of application Ser. No. 07/873,681, filed on Apr. 24, 1992, abandoned, which is a continuation of application Ser. No. 07/617,928, filed on Nov. 26, 1990, abandoned, which a continuation of application Ser. No. 07/167,313, filed on Mar. 11, 1988, abandoned.

BACKGROUND OF THE INVENTION

1. Field of the Invention

The present invention relates to a superconducting wire using a compound superconductor and a method of manufacturing the same and, more particularly, to a superconducting wire suitable for an oxide superconductor and a method of manufacturing the same.

2. Description of the Related Art

Conventionally, A15, B1, Chevrel, and Laves metal-based compound superconductors are known. Oxide ceramic-based superconductors having a crystal structure such as perovskite and layered perovskite superconductors are also known.

Of these superconductors, a layered perovskite oxide superconductor such as an La—Ba—Cu—O superconductor has a critical temperature of 30K or higher at which the superconductor does not exhibit superconducting characteristics of a oxygen deficient perovskite oxide superconductor, e.g., a Y—Ba—Cu—O superconductor, some have critical temperatures exceeding 90K. A variety of applications have been proposed for these oxide ceramic-based superconductors since they have high critical temperatures, and these superconductors are receiving a lot of attention.

High-temperature superconductors are applied to, e.g., a superconducting magnet, a transmission line, and the like. These applications are wires, and a demand has arisen for manufacturing a wire using the above-mentioned oxide ceramic-based superconductor.

However, since sintering is performed in the manufacture of the oxide superconductor, pellets can only be manufactured. Therefore, the oxide superconductor can hardly be applied to a superconducting magnet and a transmission line.

SUMMARY OF THE INVENTION

It is an object of the present invention to provide a superconducting wire using a compound superconductor, especially, an oxide superconductor and a method of manufacturing the same.

It is another object of the present invention to provide a superconducting wire which allows a current to effectively flow therethrough, and a method of manufacturing the same.

It is still another object of the present invention to provide a superconducting coil using an oxide superconducting wire.

A first superconducting wire according to the present invention has a tubular sheath member, and an oxide superconductor filled in the sheath member.

A second superconducting wire according to the present invention has an Ag matrix, and an oxide superconductor dispersed in the matrix.

A third superconducting wire according to the present invention has an oxide superconductor and a metal core member buried therein.

A method of manufacturing the first superconducting wire according to the present invention comprises the step of: filling a starting material for forming an oxide superconductor, in a sheath member to form a filled member; processing the filled member into a wire shape; performing a heat treatment of the filled member to convert the starting material filled in the sheath member into an oxide superconductor which is conductive enough to effectively flow a current.

A method of manufacturing the second superconducting wire according to the present invention comprises the steps of: molding an Ag alloy containing a metal for constituting an oxide superconductor into a linear shape; and performing a heat treatment of the linear Ag alloy in an oxidizing atmosphere to form an oxide superconductor in an Ag matrix.

A method of manufacturing the third superconducting wire according to the present invention comprises the steps of; filling a starting material for forming an oxide superconductor, in a metal tube to form a filled member; inserting a metal core member in the metal tube along the longitudinal direction of the wire; processing the filled member into a wire shape; removing the metal tube from the filled member; and performing a heat treatment of the wire to form an oxide superconductor which is conductive enough to effectively flow a current therethrough.

According to the present invention, since an oxide superconductor is integrated with a sheath member or an Ag matrix or a core member to form a wire, a superconducting wire using the oxide superconductor can be very easily obtained. Since the wire can be a continuous member, a current can be effectively flowed through the wire. The superconducting wire of the present invention can be wound to obtain a superconducting coil.

BRIEF DESCRIPTION OF THE DRAWINGS

FIG. 1 is a cross sectional view showing a superconducting wire according to a first embodiment of the present invention;

FIG. 2 and FIG. 3 are cross sectional views showing wires according to modifications of the first embodiment;

DETAILED DESCRIPTION OF THE PREFERRED EMBODIMENTS

Figure 4:
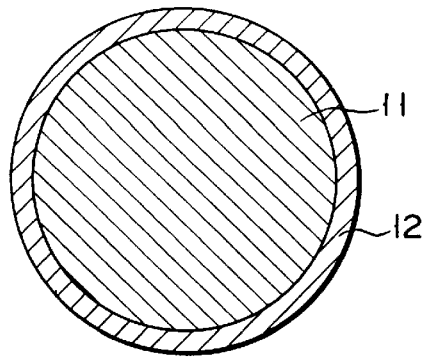
FIG. 4 is a cross sectional view showing a superconducting wire according to a second embodiment of the present invention.

The present invention will be described in detail with reference to the accompanying drawings.

FIG. 1 is a sectional view showing a superconducting wire according to a first embodiment of the present invention. In FIG. 1, reference numeral 1 denotes an oxide superconductor. Oxide superconductor 1 is covered by tubular sheath member 2.

Oxide superconductor 1 may be a continuous oxide exhibiting superconducting characteristics, and is normally formed by a sintering powder. Oxide superconductor 1 may be formed of an oxide having a perovskite type structure in a broad sense such as a layered perovskite oxide having a composition represented by $(La_{1-x}M_x)_2CuO_4$ (x indicates atomic %, and falls within the range of $0 \leq x < 0.1$, and M is an element selected from the group consisting of: Ba, Sr, and Ca), or, a oxygen deficient perovskite oxide having a composition represented by $ABa_2Cu_3O_{7-\delta}$ ($\delta \leq 0.2$, and A is an element selected from the group consisting of: Y, Yb, Ho, Dy, Eu, Sm, Gd, Nd, La, Er, Tm, and Lu). The former has a critical temperature of about 30K, and the latter has a critical temperature of about 90K. In the latter, Ba may be partially substituted with Sr or Ca.

Sheath member 2 may have a low electric resistance and a high heat conductivity, or have a good workability and a high mechanical strength. For example, Ag, Au, Pt, Pd, or their alloys are preferable. Alternatively, sheath member 2 may be formed of Cu, Nb, or their alloys, stainless steel, or the like. Since sheath member 2 serves as a reinforcing member of oxide superconductor 1, the superconducting wire can be easily formed into, e.g., a coil shape. When sheath member 2 is formed of Ag, Au, Pt, Pd, or their alloys, sheath member 2 serves as a stabilizer of oxide superconductor 1, as will be described later.

In order to enhance the reinforcing effect, 1 or more core members may be provided inside superconductor 1, e.g. FIG. 2 pictures 3 core members 6.

A method of manufacturing the superconducting wire will be explained below.

A starting material for forming oxide superconductor 1 is filled in sheath member 2. Examples of the starting material are metals containing an oxide superconductor or their oxides, or carbonates, nitrates, oxalates, hydroxides, or the like which can be converted to oxides by heating. These materials are mixed at predetermined ratios. The mixture may be calcined and ground, and may then be filled in sheath member 2. Alternatively, after the mixture is completely sintered, the sintered body may be ground and filled in sheath member 2. The form of the starting material can be either a powder or a linear member. For example, metal wires which are respectively formed by metal elements for constituting an oxide superconductor may be simultaneously inserted in sheath member 2. The starting material can be inserted in the form of a molded body. In this case, the generation of pores and cracks in the superconducting wire can be eliminated. The molding pressure is preferably 1 to 5 t/cm².

When a core member is used, the core member is inserted simultaneous to the insertion of the starting material in sheath member 2. When the starting material is inserted in the form of a molded body, it may be molded together with the core member. Thus the resultant molded body with the core member may then be inserted into a sheath member. Alternatively, a hole is formed in a portion of a molded body, and after the molded body is inserted in the sheath member, the core member may be inserted in the hole.

The above-mentioned starting material components are mixed so that oxide superconductor 1 has a stoichiometric composition. Even if the composition is slightly altered due to variations in the manufacturing conditions or the like, the superconducting characteristic can still be maintained. For example, if a Y—Ba—Cu—O composition is used as oxide superconductor 1, 2 mol of Ba and 2 mol of Cu must be mixed with respect to 1 mol of Y, according to the stoichiometrical point of view. However, in practice, the Y content can fall within the range of 0.8 to 1.2 mol, the Ba content can fall within the range of 1.8 to 2.2 mol, and the Cu content can fall within the range of 2.5 to 3.5 mol.

A member filled with the starting material is formed into a wire. This process can be achieved by extrusing, swaging, wire drawing, rolling or the like. In this case, a sectional shape of the wire is not limited to a circular shape but may be of other various shapes, such as a ribbon shape.

After this process, the wire is subjected to a heat treatment. The heat treatment is performed under sintering conditions such that the starting material components inside sheath member 2 are caused to react thereby providing a composition of the oxide superconductor, and are substantially converted to a continuous body. Preferably, the heat treatment is performed in an oxidizing atmosphere. With this treatment, the superconductor starting material is converted to continuous oxide superconductor 1, and a current can be effectively transmitted therethrough. The heat treatment can be appropriately set so that oxide superconductor 1 is formed. When oxide superconductor is subjected to the heat treatment with sheath member 2, the melting point of sheath member 2 corresponds to the upper limit of the heat treatment temperature. The lower limit of the heat treatment temperature is about 500° C. although it differs depending on the compositions of the oxide superconductor.

If diffusion of constituting elements such as Cu, O and the like occurs between sheath member 2 and the starting material during the heat treatment, the composition of oxide superconductor 1 falls outside a predetermined range, and superconducting characteristics may be degraded. As for the sheath member serving as the stabilizer, if diffusion of, e.g., oxygen from the starting material becomes noticeable, an increase in electric resistance or a decrease in heat conductivity occurs. Therefore, if a sheath member causing such a problem must be employed, as shown in FIG. 3 sheath member 5 comprising inner member 3 and outer member 4 is used. Outer member 4 is formed of a material which may cause the above problem, and inner member 3 is formed of a stable material such as Ag, Au, Pt, Pd or an alloy thereof. Thus, an adverse influence due to atomic diffusion can be prevented. Especially, when a Cu-containing material such as La—Ba—Cu—O is used as an oxide superconductor and relatively inexpensive Cu or a Cu alloy such as Cu—Ni is used for a sheath member, Cu or the like is used as outer member 4, and Ag or the like is used as inner member 3. Thus, a deviation in oxide superconductor from a predetermined composition range due to Cu diffusion, and a decrease in heat conductivity due to oxygen diffusion into the sheath member can be effectively prevented. In this manner, if the sheath member adopts a double structure, outer member 4 may be formed after the starting materials are filled in inner member 3, or the starting materials may be filled after a sheath member is formed by inner and outer members 3 and 4.

Depending on preparation conditions, heat treatment conditions, or the like of the starting materials, oxygen may often be short from a composition which is necessary for the oxide superconductor to exhibit predetermined superconducting characteristics. In this case, sheath member 2 is partially cut or chemically removed along the longitudinal direction of a wire, so that the starting materials are in contact with an external oxidizing atmosphere during a heat treatment to sufficiently supply oxygen. If sheath member 5 having the double structure is employed as described above, outer and inner members 4 and 3 are partially cut or chemically removed, and then, a heat treatment is performed.

Of the materials for the sheath member, Ag is easy to diffuse oxygen, and is not easily oxidized. Therefore, when Ag or an Ag alloy is used for a sheath member, oxygen can be sufficiently supplied from the outside during the heat treatment. For this reason, a short supply of oxygen to the internal oxygen superconductor and a degradation of mechanical characteristics of a wire due to oxidation of the sheath member itself can be eliminated. If Ag is used for the sheath member, a heat treatment is preferably performed in an oxidizing atmosphere such as an oxygen atmosphere or air at a temperature of about 500 to 940° C. If the heat treatment temperature is below this range, oxygen diffusion is too slow, and if it exceeds the range, the wire element may be deformed. If the sheath member is formed of Au, Pt, or Pd, or their alloys, they are not easy to oxidize. Therefore, substantially the same effect as that obtained when the sheath member is formed of Ag or the Ag alloy can be provided.

Note that when the sheath member is formed by Cu, Nb, or their alloys, or stainless steel, since these materials have low oxidation resistance, the sheath member is loaded after the oxide superconductor is subjected to a heat treatment. For example, when the superconducting wire shown in FIG. 1 is manufactured, an oxide superconductor forming material is loaded in a Cu tube, and the resultant tube is elongated by, e.g., swaging, as described above. Then, the tube is mechanically or chemically removed. In this case, since the oxide superconductor forming material is compression-molded by, e.g., swaging, the linear shape can be maintained after the tube is removed.

Thereafter, the linearly molded body is subjected to a heat treatment under appropriate conditions to be converted into oxide superconductor 1.

Superconductor 1 is covered with sheath member 2, thus forming a superconducting wire.

Note that a single-core wire has been exemplified. However, a multi-lumen tube can be used for the sheath member, or a plurality of single-core wires manufactured as described above can be bundled to constitute a multi-core wire.

When the superconducting wire having the above structure is wound, a superconducting coil using an oxide superconductor can be obtained.

Figure 5:
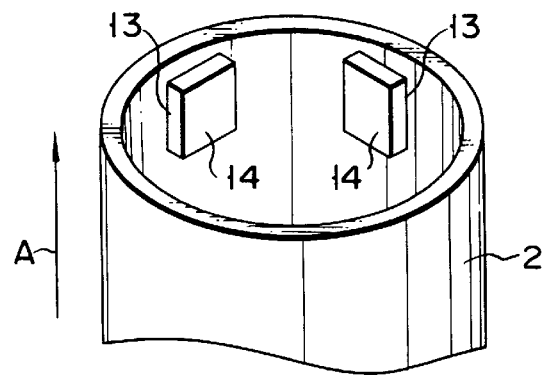
FIG. 5 is a view for explaining a preferred orientation of oxide superconductor crystal grains of the wire shown in FIG. 4.

A second embodiment will be described below. As shown in FIG. 4, in this embodiment, perovskite type oxide superconductor 11 is covered with sheath member 12, thus constituting a superconducting wire. The same materials as in the first embodiment can be used for sheath member 12. Perovskite type oxide superconductor 11 used in this embodiment can be a layered perovskite or a oxygen deficient perovskite superconductor, as described in the first embodiment. As shown in FIG. 5, C planes 14 of crystal grains 13 are oriented along longitudinal direction (a direction indicated by arrow A) of a wire. In the perovskite superconductor, a superconducting current flows along the C planes of the crystal grains. Therefore, since the crystal grains are oriented as described above, the superconducting current can easily flow in the longitudinal direction of the wire, and a current density of the superconducting wire can be increased. Note that perovskite oxide superconductor 11 need not achieve a 100% orientation, and an orientation rate can only be about 70% or more. The orientation rate can be obtained such that X-rays are radiated on an internal oxide superconductor excluding sheath member 12 of the superconducting wire of this embodiment, and a change in diffraction intensity of the C planes is measured.

A method of manufacturing the superconducting wire of this embodiment will be described below. First, powders of metals for constituting an oxide superconductor or their oxides, or carbonates, nitrates, oxalates, hydroxides, and the like which are converted to oxides by heating are used, and are mixed at a predetermined mixing ratio to provide a composition of the perovskite superconductor oxide. The mixture is ground and dried. Thereafter, the powder mixture is sintered at a temperature of 800 to 1,000° C. for several hours to 3 days to react with each other and to crystallize. The sintered body is ground by a ball mill or other known means to obtain a perovskite type oxide superconductor powder. In this case, crystals of the superconductor are cracked along their cleavage planes into micro grains. This grinding is preferably performed until powder grains are substantially ground into single-crystal grains. Since the crystal of the perovskite type oxide superconductor is selectively grown along the C plane, each crystal grain has a flat shape having the C plane as a wide plane, as shown in FIG. 5. Grinding is performed as described above, so that a grain size [a diameter of the C plane (major axis on the C plane) of the crystal grain] of powder grains substantially the same as single crystal grains falls within a range of 1 to 5 $\mu$m, and a ratio of the grain size of the powder grain to its thickness (i.e., a ratio of a diameter of the C plane of the crystal grain to a length in the C axis) falls within the range of 3 to 5. As will be described later, powder grains are easily oriented in sheath member 12. Note that the powder may be classified so that granulated powder grains fall within the above ranges, as needed.

The resultant powder is filled in a tubular sheath member having an outer diameter of 20 mm and an inner diameter of 15 mm, and the powder inside the sheath member is compacted from the outside the sheath member by, e.g., a press machine. Thereafter, the resultant sheath member is subjected to cold wire drawing, so that the outer diameter of the sheath member is reduced to 1/10 or less, preferably, 1/20 or less the original diameter. Thus, a wire in which packing density of the powder falls within the range of 50 to 90%, and its orientation rate is at least 70%, and, preferably, 80 to 90% can be obtained. In this case, if the ratio of the diameter of the C plane of each perovskite type superconductor powder grain to the length in the C axis falls within the range of 3 to 5, the superconductor powder in the sheath member can be oriented by only the above-mentioned diameter reducing process. In this case, the ratio of the diameter of the C plane of the superconductor powder grain to the length in the C axis, and a degree of a reduction in diameter are adjusted, so that the superconductor powder can be oriented at a desired orientation rate. Note that during this process, the wire may be subjected to a heat treatment as needed.

Thereafter, a heat treatment is performed in air or oxygen-containing atmosphere at 800 to 940° C. for several hours to a day, and the temperature is gradually decreased to room temperature at a rate of 3° C./min. During cooling, the temperature of 400 to 700° C. can be maintained for about 10 hours. Since the heat treatment is performed, Ag, Au, Pt, Pd, or their alloys are preferably used as the sheath member. These materials are hard to be oxidized at high temperatures, and have good oxygen permeability, it can be prevented that oxygen in the perovskite oxide type superconductor is rendered short to impair superconducting characteristics.

The wire manufactured as described above can be wound to manufacture a superconducting coil.

In this embodiment, a multi-core wire can be formed as in the first embodiment.

Figure 6:
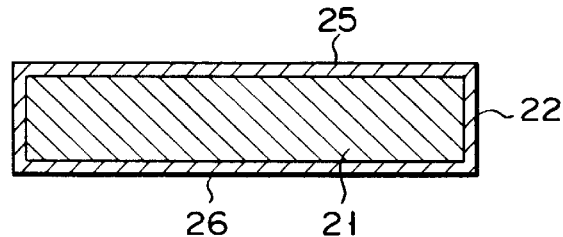
FIG. 6 is a sectional view showing a superconducting wire according to a third embodiment of the present invention.
Figure 7:
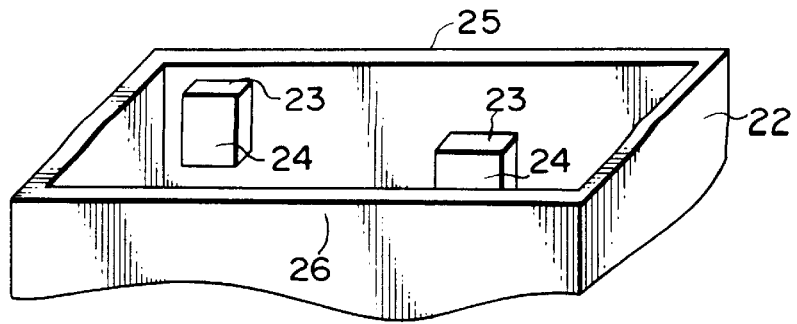
FIG. 7 is a view showing a preferred orientation of oxide superconductor crystal grains of the wire shown in FIG. 6.

A third embodiment will be described below. In this embodiment, as shown in FIG. 6, a superconducting wire constituted by perovskite oxide superconductor 21 and sheath member 22 is formed into a flat shape (having a rectangular section) having a pair of flat planes 25 and 26, and C planes 24 of crystal grains 23 of oxide superconductor 21 are oriented along flat planes 25 and 26, as shown in FIG. 7. Sheath member 22 can be formed of the same material as in the first and second embodiments. Perovskite type oxide superconductor 21 used in this embodiment is the same as that described in the first and second embodiments. Note that the superconducting wire need only be substantially flat, and its cross section need not always be rectangular. That is, crystal grains need only be oriented along a substantially flat plane.

With this structure, a superconducting current can be easily flowed in the longitudinal direction of the superconducting wire, and a current density of the superconducting wire can be increased. In addition, as will be described later, when a coil is formed by winding a superconducting wire such that a magnetic flux generated inside the coil is parallel to the flat plane during energization, a magnetic field formed by the current flowing through the coil can be increased.

In order to manufacture the above-mentioned wire, basically the same processes as in the second embodiment are carried out excluding a process of flattening the wire. More specifically, the same perovskite type oxide superconductor powder as in the second embodiment is filled in a sheath member having an outer diameter of about 20 mm and an inner diameter of about 15 mm, and the sheath member is pressed by a press or a swaging machine. Thus, a wire having packing density of 50 to 90% and a flat shape is formed. In this case, a ratio of the width to the thickness of the wire is preferably set to be 2 or larger. With this process, the superconductor powder in the sheath member can be oriented at an orientation rate of 70% or more. When an elongated superconducting wire is to be manufactured, the following two methods can be adopted. In a first method, after the superconductor powder inside the sheath member is compacted by, e.g., a press machine from the outside the sheath member, the sheath member is passed through a plurality of roller dies or normal dies, so that this member has an elliptic section having a large ratio of its major and minor axes, thus forming a wire. In this case, the major axis of the member is set to 1/10 or less, preferably, 1/20 or less the original diameter of the sheath member. Thereafter, the surface of the wire is flattened by a cylindrical roller.

In a second method, after the powder inside the sheath member is compacted by, e.g., a press machine from the outside the sheath member in the same manner as in the first method, the sheath member is subjected to swaging or wire drawing, so that the outer diameter of the member is reduced to 1/10 or less, preferably, 1/20 or less the original outer diameter, thus forming a wire. Thereafter, the wire is flattened using a cylindrical roller. Thus, the C planes of the powder grains can be easily oriented along the flat plane. In the first method, since the powder grains begin to orient from a stage where a filling rate of the powder is relatively low, a higher orientation rate can be obtained. In this embodiment, a heat treatment may be conducted during a process of forming a wire, as needed, in the same manner as in the second embodiment.

Thereafter, the same heat treatment as in the second embodiment is performed to render the superconductor powder continuous, thereby obtaining a superconducting wire.

Figure 8:
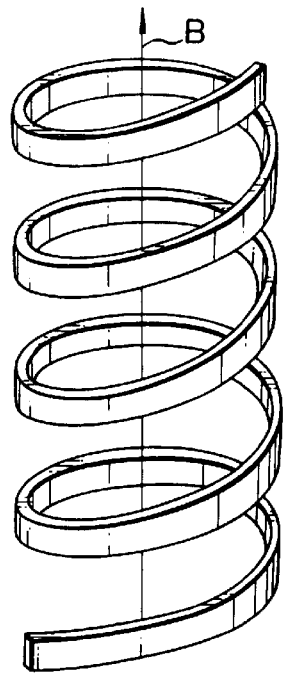
FIG. 8 is a front view showing a coil formed by winding the wire shown in FIG. 6.

In order to form the resultant superconducting wire into a coil, as shown in FIG. 8, the superconducting wire is wound into a desired coil shape so that its flat planes 25 and 26 are parallel to a direction of a magnetic flux generated inside the coil (e.g., a direction indicated by arrow B) when the coil is energized. In this case, since the C planes of the crystal grains of the oxide superconductor are oriented in the direction of a magnetic field generated inside the coil, a critical magnetic field is improved. In the perovskite type oxide superconductor, a value of the critical magnetic field perpendicular to the C planes is noticeably smaller than that in a magnetic field parallel to the C planes. Therefore, if a wire is formed with random orientation directions of crystal grains, no sufficiently large magnetic field can be formed. In this embodiment, however, since crystal grains are oriented to increase the critical magnetic field, a sufficiently large magnetic field can be obtained. With this coil, an electromagnetic force can be generated in a direction perpendicular to the flat planes of the superconducting wire.

This embodiment is not limited to a single-core wire either as in the first and second embodiments, and a multi-core wire may be adopted.

A fourth embodiment will be described below. A superconducting wire of this embodiment is formed such that an oxide superconductor is formed in an Ag matrix. An oxide superconductor having the same composition as in the first embodiment, e.g., a perovskite type oxide superconductor, is used.

In order to manufacture the superconducting wire, an Ag alloy containing metals for forming an oxide superconductor is processed to form a wire. Examples of elements contained in the Ag alloy are La, Ba, Sr, Y, Cu, and the like. The wire can have an arbitrary shape, and is formed into, e.g., a ribbon-like shape. Upon preparation of the alloy, Ag and other metals are charged in a reaction chamber such as a crucible to have a predetermined composition, and are melted. In this case, since La, Ba, Sr, Y, Cu, and the like as alloy components are easily oxidizable, melting is preferably performed in an inert atmosphere. A water-cooled copper crucible free from impurity contamination is preferably used as a reaction chamber.

In order to process this alloy into a wire, swaging, wire drawing, or rolling is performed. This process is preferably a hot process rather than a cold process. Since the case of the cold process, elements such as La and Ag undesirably form fragile intermetallic compound, the wire is broken during working.

Note that a wire may be formed by rapidly cooling a molten alloy without performing the above-mentioned process.

Thereafter, the Ag alloy wire formed in the above process is subjected to an oxidizing atmosphere such as air or an oxygen gas atmosphere. With this heat treatment, oxygen in the atmosphere is diffused in the alloy, and reacts with oxide superconductor elements in the alloy. Thus, the oxide superconductor is formed in the Ag matrix. Since Ag has excellent electrical and heat conductivities, it is effective as a stabilizer for an oxide superconductor. Since Ag easily diffuses oxygen, oxygen is easily diffused in the Ag alloy during the heat treatment, and the oxide superconductor can be easily formed. In addition, since Ag itself is rarely oxidized, characteristics of a stabilizer will not be degraded.

The heat treatment is preferably performed at a temperature of 400 to 940° C. If the heat treatment temperature is below 400° C., reaction of producing the oxide superconductor is very slow, resulting in inconvenience. If the temperature exceeds 940° C., an oxide superconductor undesirably becomes large in grain size and aggregated.

Figure 9:
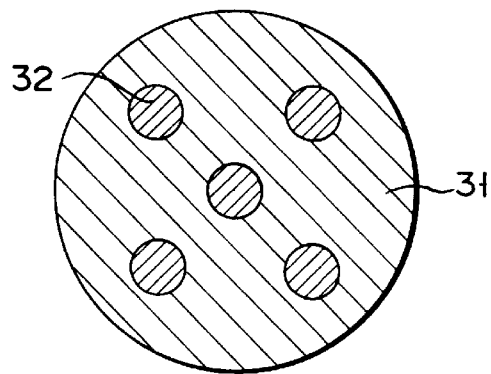
FIGS. 9 and 10 are sectional views showing a superconducting wire according to a fifth embodiment of the present invention.

A fifth embodiment of the present invention will be described below. As shown in FIG. 9, 1 or more (5 in FIG. 9) metal core members 32 are buried in oxide superconductor 31 along the longitudinal direction of the wire. Oxide superconductor 31 has the same composition as in the first embodiment.

Each core member 32 is preferably a metal wire having high heat conductivity and electric conductivity, good machinability, and high mechanical resistance. These conditions need not be satisfied by one type of metal, and a plurality of types of metal wires may be bundled or twisted as the metal wire. As core member 32, Cu, Ag, Pu, Pt, Pd, Ti, or their alloys, stainless steel, or the like can be used.

Figure 10:
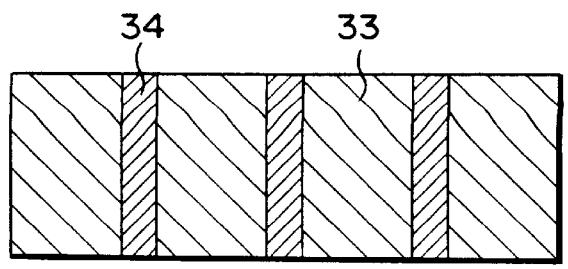

Note that as shown in FIG. 10, planar core member 34 may be buried in oxide superconductor 33. In this case, core member 34 can comprise an alloy plate of a plurality of types of thin metal plates.

In order to manufacture the superconducting wire described above, the same oxide superconductor material powder as in the first or second embodiment or a crystallized perovskite type oxide superconductor powder is inserted in a metal tube together with the core member, and the two ends of the tube are closed by a metal member. Thereafter, following the same procedures as in the first embodiment, the outer diameter of the metal tube is reduced to $\frac{1}{10}$ or less and preferably, $\frac{1}{20}$ or less an original outer diameter, thus forming a wire. Thereafter, the resultant wire may be subjected to rolling as needed.

In the above description, the starting material is inserted in the form of the powder. However, the powder may be compression-molded to prepare a columnar molded body. The molded body may be inserted in the metal tube, and the resultant tube may be subjected to a diameter-reduction process. In this case, the molded body may be manufactured while the core member is buried in the powder. Alternatively, when linear core members are employed, a molded body having a plurality of holes extending along the longitudinal direction is formed, and the core members may be inserted in the holes. When a planar core member is employed, a plurality of molded bodies having shapes divided by the core member are prepared, and after the core member is inserted in the metal tube, the molded bodies may be inserted therein. In these cases, the molding pressure is preferably set to fall within the range of 1 to 5 t/cm². In this manner, when the diameter-reduction process is performed after the superconducting oxide is compression-molded, the packing density of the starting material can be increased, and generation of pores or cracks inside the superconducting wire can be minimized.

The material of the metal tube is not particularly limited as long as it has good machinability. However, in view of machinability and economy, Cu is preferable.

After the diameter-reduction process, the metal tube is removed from the resultant wire. This process is achieved such that the metal tube is brought into contact with an etching solution such as nitric acid to be etched.

The wire without the metal tube is subjected to a heat treatment to obtain a superconducting wire. The heat treatment is preferably performed in an oxygen-containing atmosphere at 850 to 980° C. for 8 to 80 hours. Thereafter, the temperature is gradually decreased from 600° C. at a low cooling rate of 1° C./min, so that oxygen is introduced in oxygen deficiencies of the oxide superconductor, thus improving the superconducting characteristics.

In order to achieve such oxygen introduction, the temperature may be maintained at 300 to 700° C. for 3 to 50 hours.

As the core members, since Ag, Au, Pt, Pd, or their alloys are not oxidized by a heat treatment, they are more preferable. In contrast to this, if a metal which is easily oxidized, such as Cu or a Cu alloy is employed, an oxygen deficient layer and the like are formed on the surface of the oxide superconductor, and the superconducting characteristics are degraded. However, since these layers do not expand beyond a given thickness, they do not cause disadvantages.

In this manner, since core members are provided, the wire can be relatively easily formed into a coil.

EXAMPLE 1

$La_2O_3$, $SrO_3$, and CuO were mixed using a ball mill at a mixing ratio of 0.9 mol of $La_2O_3$ and 0.2 mol of $SrCO_3$ with respect to 1 mol of CuO. The mixture was calcined at 900° C. Thereafter, the calcined body was again ground and mixed to prepare a powder as a superconductor starting material. The starting material was filled inside a tubular Ag sheath member in an oxygen-containing gas atmosphere. Thereafter, the two open ends of the sheath member were closed and integrated. The integrated member was subjected to swaging, wire drawing, or the like until a ratio of reduction in sectional area exceeded about 100 or more, thus obtaining a wire having an outer diameter of 2 mm. Thereafter, an oxygen gas was supplied in a furnace at a flow rate of 1 l/min, and a heat treatment was performed at 900° C. for 15 hours. Thereafter, the interior of the furnace was gradually cooled to 500° C. at a rate of 1° C./min, and a heat treatment was performed at 500° C. for 15 hours. Then, the interior of the furnace was gradually cooled to room temperature.

With this heat treatment, the starting material components inside the sheath member were reacted to produce a continuous body of a layered perovskite oxide superconductor represented by formula $(La_{0.9}Sr_{0.1})CuO_4$. Thus, a superconducting wire could be obtained. Upon examination of the superconducting characteristics of the superconducting wire, the superconducting wire had good characteristics, i.e., a critical temperature of 35K, and a critical current at 4.2K of 10 A. Note that the same result was obtained when sheath members of Ag alloy, Au, Pt, Pd, and their alloys were used in place of the Ag sheath member. The same result was also obtained when an Ag core member was used.

EXAMPLE 2

Following the same procedures as in Example 1, a compound superconducting wire of a layered perovskite oxide superconductor represented by formula $(La_{0.925}Ba_{0.075})_2CuO_4$ was obtained using $La_2O_3$, $BaCO_3$, and CuO.

The wire had good characteristics, i.e., a critical temperature of 32K and a critical current at 4.2K of 8 A.

EXAMPLE 3

Following the same procedures as in Example 1, a compound superconducting wire of a layered perovskite oxide superconductor represented by formula $(La_{0.95}Ca_{0.1})_2CuO_4$ was obtained using $La_2O_3$, $CaCO_3$, and CuO.

The wire had good characteristics, i.e., a critical temperature of 29K and a critical current at 4.2K of 5 A.

EXAMPLE 4

Following the same procedures as in Example 1, a superconducting wire of a oxygen deficient perovskite oxide superconductor represented by formula $YBa_2Cu_3O_{7-\delta}$ was obtained using $Y_2O_3$, $BaCO_3$, and CuO.

The wire had good characteristics, i.e., a critical temperature of 90K and a critical current at 77K of 4 A.

Note that when La was employed in place of part or all of Y, substantially the same result was obtained.

EXAMPLE 5

After the sheath members of the integrated members before the heat treatment in Examples 1 to 4 were partially cut along their longitudinal direction using $HNO_3$ or aqua regia, these members were subjected to the same heat treatment as in the above Examples. The critical current of each Example was doubled.

EXAMPLE 6

A starting material prepared by mixing La, Sr, and Cu at a given mixing ratio to obtain a layered perovskite oxide superconductor represented by formula $(La_{0.9}Sr_{0.1})_2CuO_4$ was filled in an Cu tube, and the two open ends of the sheath member were closed. Thereafter, the resultant member was processed to be elongated, and the Cu tube was removed using $HNO_3$. Thereafter, the same oxidizing heat treatment as in Example 1 was performed in air at 900° C. As a result, a continuous body of a layered perovskite oxide superconductor represented by formula $(La_{0.9}Sr_{0.1})_2CuO_4$ was produced. Thereafter, a Cu sheath member was coated around the oxide superconductor.

The good characteristics, i.e., a critical temperature of 35K and a critical current at 4.2K of 10 A, were obtained.

EXAMPLE 7

Following the same procedures as in Example 6 except for using Ba in place of Sr, a superconducting wire was produced.

The good characteristics, i.e., a critical temperature of 29K and a critical current at 4.2K of 5 A, were obtained.

EXAMPLE 8

Following the same procedures as in Example 6 except for using Ca in place of Sr, a superconducting wire was produced.

The good characteristics, i.e., a critical temperature of 29K and a critical current at 4.2K of 5 A, were obtained.

EXAMPLE 9

A superconducting wire was produced following the same procedures as in Example 6, except that Y, Ba, and Cu were used in place of La, Sr, and Cu in Example 6 and were mixed at a mixing ratio of $YBa_2Cu_3O_{7-\delta}$.

The good characteristics, i.e., a critical temperature of 96K and a critical current at 77K of 8 A, were obtained.

EXAMPLE 10

A superconducting wire was produced following the same procedures as in Example 6, except that $Y_2O_3$, $BaCO_3$, and CuO were used in place of La, Sr, and Cu in Example 6 and were mixed at a mixing ratio of $(Y_{0.4}Ba_{0.6})CuO_3$.

The good characteristics, i.e., a critical temperature of 88K and a critical current at 77K of 3 A, were obtained.

EXAMPLE 11

$La_2O_3$, $SrCO_3$, and CuO were mixed using a ball mill at a mixing ratio of 0.92 mol of $La_2O_3$ and 0.2 mol of $SrCO_3$ with respect to 1 mol of CuO. The mixture was calcined at 900° C. for two hours. Thereafter, the calcined body was again granulated and mixed to prepare a powder as a superconductor starting material. The starting material was wrapped in a silver sheet in a rod-like shape and Ni plating was performed on Ag. The mixture wrapped by the sheet was inserted in a copper tube having an outer diameter of 10 mm and an inner diameter of 8 mm. Thereafter, the two open ends of the copper tube were closed and integrated. The integrated member was subjected to swaging, wire drawing, or the like until a ratio of a reduction in sectional area was about 100 or more, thus obtaining a wire having a diameter of 1 mm. Thereafter, a heat treatment was performed in vacuum at 900° C. for 15 hours. Thus, a superconducting wire covered with the double-layered sheath member was obtained. It was confirmed by X-ray diffraction that a continuous body of a layered perovskite oxide superconductor represented by formula $(La_{0.9}Sr_{0.1})_2CuO_4$ was produced inside the sheath member.

The characteristics of the superconducting wire manufactured as described above were measured. As a result, it was confirmed that the resultant wire could provide good superconducting characteristics, i.e., a critical temperature of 40K and a critical current at 4.2K of 10 A. RRR (a value obtained by dividing a room-temperature resistance by a resistance at a critical temperature; as RRR is larger, heat conductivity is larger) was as high as RRR of an $Nb_3Sn$ superconducting wire which had been conventionally used. With the method of this Example, it was revealed that copper was not oxidized by oxygen contained in the oxide superconductor starting material.

Therefore, since the superconducting wire obtained by the method described above has good superconducting characteristics and the stabilizer has heat conductivity of a stabilizer, it can be effectively applied to a superconducting magnet.

EXAMPLE 12

A superconducting wire of a layered perovskite oxide superconductor represented by formula $(La_{0.925}Ba_{0.075})_2CuO_4$ was obtained following the same procedures as in Example 10 except for using $La_2O_3$, $BaCO_3$, and CuO.

The wire had good superconducting characteristics, i.e., a critical temperature of 35K and a critical current at 4.2K of 8 A.

EXAMPLE 13

A superconducting wire of a layered perovskite oxide superconductor represented by formula $(La_{0.9}Ca_{0.1})_2CuO_4$ was obtained following the same procedures as in Example 10 except for using $La_2O_3$, $CaCO_3$, and CuO.

The wire had good superconducting characteristics, i.e., a critical temperature of 18K and a critical current at 4.2K of 3 A.

EXAMPLE 14

A superconducting wire of an oxide superconductor having a composition ratio of $YBa_2Cu_3O_{7-\delta}$ was obtained using $Y_2O_3$, $BaCO_3$, and CuO, following the same procedures as in Example 10.

The wire had good superconducting characteristics, i.e., a critical temperature of 90K and a critical current at 77K of 1 A.

EXAMPLE 15

2 mol % of a $BaCO_3$ powder, 0.5 mol % of a $Y_2O_3$ powder, and 3 mol % of a CuO powder were sufficiently mixed. The mixture was calcined in air at 900° C. for 48 hours to react with each other and ground. Thereafter, the powder starting material was reannealed in an oxygen atmosphere at 900° C. for 24 hours to react with each other. After oxygen was introduced to oxygen vacancy, the reannealed body was reground using a ball mill and was classified, thus obtaining a oxygen deficient perovskite superconductor powder (composition ratio of $YBa_2Cu_3O_{7-\delta}$) having an average grain size of 2 µm and a ratio of diameter to thickness of 3 to 5.

The oxide superconductor powder was charged in a silver pipe having an outer diameter of 20 mm and an inner diameter of 15 mm. One end of the pipe was sealed by a Ag member, and the other end was capped with a Ag stop. The stop was welded to the other end of the pipe remaining a ventilation hole. Thereafter, the resultant pipe was subjected cold wire drawing up to an outer diameter of 1 mm, and then was subjected to a heat treatment in a oxygen atmosphere at 900° C. for 12 hours.

The resultant superconducting wire was cut into pieces along its longitudinal direction, and an orientation rate of the superconductor powder in the longitudinal direction of the wire was measured. The orientation rate was about 80%, and a packing density was 80%. The superconducting characteristics of the wire were measured. As a result, a critical temperature was 87K and a critical current at 77K was 3 A.

The superconductor powder used in this Example was compression molded without orientation. The resultant molded body was subjected to a heat treatment at 900° C. for 12 hours to prepare a superconductor block. The critical temperature of the superconductor block was measured to be 85K and a critical current at 77K was 0.3 A.

EXAMPLE 16

The same oxide superconductor powder as that prepared in Example 15 was charged in an Ag pipe which had an outer diameter of 20 mm, an inner diameter of 15 mm, and a length of 100 mm, and one end of which was sealed. After the other end of the pipe was sealed, the pipe was subjected to a cold process using roller dies and dies whose ratios of major axis to minor axis were gradually increased until the section had an elliptic shape having a major axis diameter of 2 mm and a minor axis diameter of 1 mm. Finally, the resultant pipe was formed to a plate shape having a thickness of 0.5 mm and a width of 3 mm using a cylindrical roll, and the resultant structure was subjected to a heat treatment in oxygen at 900° C. for 12 hours.

The superconducting wire obtained as described above was cut into pieces along its longitudinal direction, and an orientation rate of the superconductor powder in the flat plane of the wire was measured. As a result, the orientation rate was 70% in the widthwise direction, and 75% in the longitudinal direction. The packing density of the superconductor powder in the Ag coat was 85%. The superconducting characteristics of the wire were measured. As a result, the critical temperature was 87K and a critical current measured at a temperature of 77K was 6 A.

On the other hand, the superconductor powder used in this Example was compression molded without orientation, and was then subjected to a heat treatment at 900° C. for 12 hours. As a result, the critical temperature of the superconductor block was 85K and a critical current at a temperature of 77K was 0.3 A.

EXAMPLE 17

The superconducting wire manufactured in Example 16 was formed into a coil shape having an outer diameter of 10 mm and a length of 50 mm. In this case, the coil was sintered in an oxygen atmosphere at 900° C. for 12 hours so that a direction of a magnetic flux generated inside the coil upon energization of the coil was parallel to a flat surface. A critical magnetic field of this coil was 0.1 T.

A superconductor coil having the same dimensions as in this Example was produced using a superconducting wire which had a circular section having the same sectional area as that in this Example and in which a superconductor powder was not oriented. The superconducting wire was prepared using the same superconductor powder and the Ag pipe used in this Example. The critical magnetic field of this coil was measured to be 0.01 T.

EXAMPLE 18

An alloy consisting of 8.07 wt % of La, 0.85 wt % of Sr, 8.08 wt % of Cu, and the balance of silver was prepared in a water-cooled copper crucible using a plasma arc melting furnace. The resultant alloy was subjected to hot processes, i.e., swaging and wire drawing at a temperature of 600° C., thus obtaining a wire having a diameter of 2 mm. The wire was then subjected to a heat treatment in a 1-atm oxygen atmosphere at 600° C. for 96 hours. As a result, an La—Sr—Cu—O layered perovskite superconductor was formed on the surface and inside an Ag matrix.

The superconducting characteristics were examined using the compound superconducting wire. A critical temperature was 35K and a critical current at 4.2K was 10 A, demonstrating good characteristics.

EXAMPLE 19

An alloy consisting of 11.6 wt % of La, 2.5 wt % of Ba, 5.9 wt % of Cu, and the balance of silver was prepared in a water-cooled copper crucible using a plasma arc melting furnace. The resultant alloy was charged in a quartz vessel having a nozzle at its lower end, and was melted using a high-frequency furnace. Thereafter, the molten alloy was injected by an argon gas pressure onto a cooling Cu roll which was rotated at the lower end of the nozzle, so that the molten alloy was rapidly cooled in an argon atmosphere, thus producing a ribbon having a thickness of 0.5 mm and a width of 2 mm. The ribbon was subjected to a heat treatment in a 1-atm oxygen atmosphere at 650° C. for 48 hours. As a result, an La—Ba—Cu—O layered perovskite superconductor was formed on the surface and inside an Ag matrix.

The superconducting characteristics were examined using the compound superconducting wire. A critical temperature was 30K and a critical current at 4.2K was 5 A, exhibiting good characteristics.

EXAMPLE 20

An alloy consisting of 4.8 wt % of Y, 14.9 wt % of Ba, 10.3 wt % of Cu, and the balance of silver was prepared in a water-cooled copper crucible using a plasma arc melting furnace. The resultant alloy was subjected to hot swaging and wire drawing processes at 800° C. to obtain a wire having a diameter of 2 mm. The resultant wire was subjected to a heat treatment in a 1-atm oxygen atmosphere at 900° C. for 96 hours. As a result, a Y—Ba—Cu—O oxide superconductor was formed on the surface and inside an Ag matrix.

The superconducting characteristics were examined using the compound superconducting wire. A critical temperature was 83K and a critical current at 77K was 15 A, exhibiting good characteristics.

EXAMPLE 21

An oxygen-deficient perovskite type superconductor powder as in Example 15 was obtained following the same procedures as in Example 15.

The resultant oxide superconductor powder was filled in a copper tube in which five silver wires having a diameter of 3 mm and a length of 100 mm were placed and which had an outer diameter of 20 mm, an inner diameter of 15 mm, and a length of 100 mm and had one end closed by a copper member. The other end of the tube was closed by a copper stop.

Thereafter, the resultant wire was cold-worked into a wire having an outer diameter of 2 mm at room temperature by a swaging machine.

The copper tube was removed by etching using $HNO_3$. The resultant wire was sintered in an oxygen-containing atmosphere at 940° C. for 24 hours, and the temperature was then gradually decreased from 600° C. at a rate of 1° C./min, thereby obtaining an oxide superconducting wire having a section as shown in FIG. 9.

The critical current density of the resultant oxide superconducting wire in an external magnetic field of 0 T at 77K was 5,000 A/cm². When a tension of 200 kgf/cm² was applied, the critical current density in an external magnetic field of 0 T at 77K was 4,800 A/cm². Thus, the superconducting characteristics was only slightly degraded.

EXAMPLE 22

Following the same procedures as in Example 21, a wire having an outer diameter of 1.8 mm was prepared, except that two thin silver plates having a width of 10 mm, a thickness of 3 mm, and a length of 100 mm, and a single thin silver plate having a width of 15 mm, a thickness of 3 mm, and a length of 100 mm were placed to be parallel to each other in place of the silver wires.

Thereafter, the resultant wire was rolled by roller dies to obtain a tape-like member having a thickness of 1 mm and a width of 2.5 mm. Thereafter, the outer copper layer was removed by etching using $HNO_3$. The resultant structure was sintered in an oxygen-containing atmosphere at 940° C. for 24 hours, and the temperature was then gradually decreased from 600° C. at a rate of 1° C./min, thereby obtaining an oxide superconducting wire.

The critical current density of the resultant oxide superconducting wire in an external magnetic field of 0 T at 77K was 4,900 A/cm². When a tension of 2,000 kgf/cm² was applied, the critical current density in an external magnetic field of 0 T at 77K was 4,750 A/cm². Thus, the superconducting characteristics was only slightly degraded.

EXAMPLE 23

An oxygen-deficient perovskite type superconductor powder as in Example 15 was obtained following the same procedures as in Example 15.

The resultant oxide superconductor powder was compression-molded at a pressure of 1 t/cm² using metal molds to obtain a cylindrical body having a diameter of 14 mm and a length of 10 mm, and in which 4 holes having a diameter of 1.2 mm extending along the axial direction were formed at positions corresponding to ½ the radius. 10 molded bodies were coupled by inserting a silver wire having a diameter of 1 mm in their holes, and were inserted in a silver tube which had an outer diameter of 20 mm, an inner diameter of 15 mm, and a length of 100 mm, and one end of which was closed by a silver member. After the other end of the tube was closed by a silver stop, the oxide superconductor powder was compacted by a pressing machine at room temperature from the outside the silver tube. Thereafter, the tube was elongated by a swaging machine to have an outer diameter of 2 mm, and was then compressed flat to have a thickness of 1 mm.

Thereafter, the resultant structure was subjected to a heat treatment in an oxygen gas at 940° C. for 24 hours, and the temperature was then gradually decreased from 600° C. at a rate of 1° C./min, thereby obtaining a superconducting wire.

The critical temperature of the oxide superconducting wire was 87K, and the critical current density thereof was 1,100 A/cm².

What is claimed is:

1. A copper containing superconducting wire comprising:
   a tubular sheath member which comprises a material selected from the group consisting of: Ag, Au, Pt, Pd, and their alloys; and
   an oxide superconductor filled in said sheath member, wherein said oxide superconductor has a perovskite crystal structure.

2. A copper containing superconducting wire comprising:
   a tubular sheath member which comprises a material selected from the group consisting of: Ag, Au, Pt, Pd, Cu, Nb, Fe and alloys thereof; and
   an oxide superconductor filled in said sheath member, wherein said oxide superconductor has a perovskite crystal structure, with the proviso that where the oxide superconductor is in contact with the sheath, the sheath comprises a material selected from the group consisting of Ag, Au, Pt and alloys thereof.

3. A superconducting wire according to claim 2, wherein said oxide superconductor contains Cu and at least one element selected from the group consisting of: Ba, Sr, Ca, Y, Yb, Ho, Dy, Eu, Sm, Gd, Nd, La, Er, Tm, and Lu.

4. A superconducting wire according to claim 3, wherein said oxide superconductor contains a composition represented by $(La_{1-x}M_x)_2CuO_4$, wherein x indicates atomic %, $0 \leq x < 0.1$, and M is an element selected from the group consisting of: Ba, Sr, and Ca.

5. A superconducting wire according to claim 3, wherein said oxide superconductor is $(Y_{0.4}Ba_{0.6})CuO_3$.

6. A superconducting wire according to claim 2, wherein said sheath member has a double-layered structure comprising an inner layer and an outer layer.

7. A superconducting wire according to claim 6, wherein said outer layer contains Cu or a Cu alloy, and said inner layer contains a material selected from the group consisting of: Ag, Au, Pt, and their alloys.

8. A superconducting wire according to claim 2, wherein C planes of crystal grains of said oxide superconductor are oriented along a longitudinal direction of said wire.

9. A superconducting wire according to claim 8, wherein said wire is of a flat shape and has a pair of flat surfaces, and the C planes of the crystal grains of said oxide superconductor are oriented to be parallel to the flat surfaces.

10. A superconducting wire according to claim 9, wherein a crystal orientation rate of the crystal grains is not less than 70%.

11. A superconducting wire according to claim 9, wherein a ratio of a width to a thickness of said wire is not less than 2.

12. A superconducting wire according to claim 8, wherein a crystal orientation rate of the crystal grains is not less than 70%.

13. A superconducting wire according to claim 2, wherein a core member is buried in said oxide superconductor along a longitudinal direction of the wire.

14. A superconducting wire according to claim 13, wherein said core member contains a material selected from the group consisting of: Ag, Au, Pt, Pd, Cu, Ti, and their alloys.

15. A superconducting coil formed by winding a superconducting wire according to claim 2.

16. A superconducting coil according to claim 15, wherein said oxide superconductor contains Cu and at least one element selected from the group consisting of: Ba, Sr, Ca, Y, Yb, Ho, Dy, Eu, Sm, Gd, Nd, La, Er, Tm, and Lu.

17. A superconducting coil according to claim 16, wherein said oxide superconductor contains a composition represented by $(La_{1-x}M_x)_2CuO_4$ wherein x indicates atomic %, $0 \leq x < 0.1$, and M is an element selected from the group consisting of: Ba, Sr, and Ca.

18. A superconducting coil according to claim 16, wherein said oxide superconductor is $(Y_{0.4}Ba_{0.6})CuO_3$.

19. A superconducting coil according to claim 15, wherein said sheath member has a double-layered structure comprising an inner layer and an outer layer.

20. A superconducting coil according to claim 19, wherein said outer layer contains Cu or a Cu alloy, and said inner layer contains a material selected from the group consisting of: Ag, Au, Pt, and their alloys.

21. A superconducting coil according to claim 15, wherein C planes of crystal grains of said oxide superconductor are oriented along a longitudinal direction of said wire.

22. A superconducting coil according to claim 21, wherein said wire is of a flat shape and has a pair of flat surfaces, and the C planes of the crystal grains of said oxide superconductor are oriented to be parallel to the flat surfaces.

23. A superconducting coil according to claim 22, wherein an orientation rate of the crystal grains is not less than 70%.

24. A superconducting coil according to claim 22, wherein a ratio of a width to a thickness of said wire is not less than 2.

25. A superconducting coil according to claim 22, wherein said coil is formed by winding said wire so that a direction of a magnetic flux generated inside said coil is parallel to a flat surface of said wire upon energization of said coil.

26. A superconducting coil according to claim 21, wherein an orientation rate of the crystal grains is not less than 70%.

* * * * *